(12) United States Patent
Feygin et al.

(10) Patent No.: US 6,259,385 B1
(45) Date of Patent: Jul. 10, 2001

(54) SYSTEM FOR DATA TRANSCEIVING USING RUN-LENGTH CONSTRAINED CONVOLUTIONAL CODES

(75) Inventors: Gennady Feygin, Scotch Plains, NJ (US); Khurram Muhammad, Farmers Branch, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/356,388

(22) Filed: Jul. 16, 1999

(51) Int. Cl.$^7$ .................................................. H03M 7/00
(52) U.S. Cl. ............................. 341/59; 360/40; 714/701
(58) Field of Search ................................ 341/58, 59, 94; 375/240.27, 240, 240.01; 348/384.1, 390.1; 360/40, 41, 48, 53; 714/701, 755, 752

(56) References Cited

U.S. PATENT DOCUMENTS

| | | | |
|---|---|---|---|
| 5,291,499 | * 3/1994 | Behrens et al. | 371/43 |
| 5,341,386 | * 8/1994 | Shimoda et al. | 371/43 |
| 5,475,388 | * 12/1995 | Gormish et al. | 341/107 |
| 5,592,450 | * 1/1997 | Yonemitsu et al. | 369/48 |
| 5,734,787 | * 3/1998 | Yonemitsu et al. | 386/111 |
| 6,046,874 | * 4/2000 | Takahashi | 360/65 |

* cited by examiner

Primary Examiner—Michael Tokar
Assistant Examiner—Daniel D. Chang
(74) Attorney, Agent, or Firm—W. Daniel Swayze, Jr.; W. James Brady; Frederick J. Telecky, Jr.

(57) ABSTRACT

A method is disclosed for enforcing run-length limit constraints convolutional codes, comprising the steps of providing a desired run length limit constraint, providing a first convolutional code structure 202, processing data with the first convolutional code structure 202 such that convolutional code structure 202 applies a predetermined patterning to the data, evaluating and processing the data in reference to the desired run length limit constraint such that any of the data that is not compliant with the run length limit constraint is altered to become compliant, further processing said the data by a transceiver 206, providing a second convolutional code structure 204, evaluating the further processed data with convolutional code structure 204 in reference to the predetermined patterning such that data likely to have been previously altered is identified, and processing the further processed data with convolutional code structure 204 in reference to said predetermined patterning such that data identified as likely to have been previously altered is excluded.

6 Claims, 1 Drawing Sheet

SYSTEM FOR DATA TRANSCEIVING USING RUN-LENGTH CONSTRAINED CONVOLUTIONAL CODES

TECHNICAL FIELD OF THE INVENTION

The present invention relates generally to a system of coding within a data transceiving system and, more particularly, to use of run-length constrained convolutional codes, enhancing system efficiency and reducing data error rates.

BACKGROUND OF THE INVENTION

Circuitry and systems for encoding and decoding data are used extensively in modern electronics, especially in applications involving the communication or storage of data. Coding is implemented, and coding techniques are employed, by system designers seeking to provide various system functionalities.

One such functionality is detection and correction of errors in the data being processed by the system. Coding is employed to organize the data into recognizable patterns for transmission and receipt. This is accomplished by the introduction of redundancy into the data being processed by the system. Such functionality reduces the number of data errors, resulting in improved system reliability.

Another prevalent functionality addressed with coding techniques is system timing maintenance and clock recovery. Coding systems are often employed in conjunction with the data transmitted; exploiting redundancy introduced into the data to maintain or stabilize system timing, and to enable clock recovery.

Conventional methods of coding provide separate functional elements to independently address the timing and error reduction demands of the system.

As performance and efficiency demands of data transceiving systems are increased, coding systems and structures can be optimized to provide enhanced system efficiency while reducing system overhead. Appropriate design of a coding system can efficiently address system timing requirements and contribute to reduction of system error rates.

SUMMARY OF THE INVENTION

Data processing is used extensively in modem electronics; whether the data is being stored and retrieved, as in a computer, or the data is being transmitted and received, as in a telecommunications system. Transceiving and processing large amounts of data at demanding system speeds gives rise to a number of challenges for system designers. A significant one of such challenges is the problem of addressing errors introduced into the data by processing. Depending on the nature of the data processing system, there are many possible sources of data errors. Examples of such sources include inter-symbol interference, in a data storage context, and noise and signal attenuation in a data transmission context.

A common measure of the magnitude or frequency of errors occurring in the data is referred to as the bit error rate ("BER"). The bit error rate can be defined generally as a relation between the number of data bits in error and the total number of data bits processed.

In the past, designers could decrease BER by increasing the signal power associated with the data being transmitted. By increasing signal power, effects of noise and interference were diminished, allowing for fewer errors. This approach is not desirable in many of today's electronic systems, however, as many of these systems demand minimal power consumption throughout the system. Additionally, where inter-symbol interference is a factor, the power of interfering signals increase proportionally, rendering this approach useless.

Another approach to decreasing BER has employed various coding techniques, formatting the data for processing. These coding techniques commonly introduce redundancy into the data about to be processed, such that the data is organized into predetermined patterns. This reduces the BER. Another system using no coding and having the same BET would require higher signal power to be transmitted. The reduction in the transmitted power achieved by the former system is referred to as coding gain.

Coding techniques have also been utilized to allow system designers to provide other functionality within the system. Specifically, redundancy of the data being processed by a system has been exploited to maintain a system timing sequence desired by the user.

Conventional methods of addressing these timing issues employ run length limited ("RLL") encoding and decoding structures. RLL structures are generally employed to constrain the the number of zero bits ("zeroes") transmitted consecutively by a processing system. The RLL structures enforce minimum and maximum thresholds, and are typically designated by RLL(min, max). Thus, in an RLL(0,8) system, for example, the minimum number of consecutive zeroes allowed is 0 (no minimum requirement), and the maximum number of consecutive zeroes allowed is 8. Too many zeroes transmitted in the data being processed may cause system timing circuitry to run out of synchronization; too few may cause inter-symbol interference. Either case may result in numerous errors in the data transceiving. Thus, the sole purpose for RLL coding structures is the maintenance of timing synchronization in the system; no other functionality is associated with the RLL structures.

However, in a data processing system employing an RLL structure, the probability of an RLL constraint being violated is very small; being roughly equivalent to 2 raised to the power of the negative of the threshold value. For example, in an RLL (0,8) system, the probability of 8 consecutive zeroes being transmitted in the data processed would be roughly equivalent to $2^{-8}$. Thus, occurrence of such constraint violations is very infrequent, rendering the RLL structure superflous during most of the system operation. RLL structures thus represent unused system overhead (i.e. underutilized circuitry or other implementation structure) during most of the system operation.

It is thereby desirable to provide a coding system that ensures system timing and synchronization without requiring unutilized or underutilized system overhead.

Further, conventional methods employ separate coding systems, distinct and independent from the RLL structures, to address error reduction concerns and effect coding gain. Standard error detection/correction codes are normally used for obtaining coding gain. Standard codes introduce redundancy into data being processed by the system. This patterning of data utilizes more processed data bits to represent a lesser number of actual information data bits. Redundancy is introduced by the system in a pattern predetermined by the system designer or user. Such patterning allows a system designer or user to designate particular sequences of data as allowable, or dis-allowable, by the system.

As data is processed by the system, noise, interference, and other factors may alter the data. Using these standard codes to disallow certain sequences of data, a system can evaluate the data processed. If the data possibly or actually contains errors, the system can then map it to the closest allowable data sequence designated by the code. This methodology is often referred to as maximum likelihood detection.

Convolutional codes have been employed as sources of coding gain. However, conventional convolutional codes require a significant number of data bits to be addressed by the system. In many applications, such as high performance data storage systems—where density and reliability demands are constantly increasing—results yielded by normal convolutional codes are not desirable, as they require too many data bits.

It is thereby desirable to provide a coding system that is efficiently optimized to provide coding gain in system operation.

Apparently, a heretofore unrecognized problem in systems employing RLL coding structures to timing constraints has been the system efficiency resulting from unutilized or underutilized system overhead associated with dedicated RLL structures, actual activation of which is rare.

It is thereby further desirable to provide an optimized code structure that dually ensures system timing and synchronization and efficiently provides coding gain in system operation.

The present invention overcomes the aforementioned limitations of current methods by a system that provides coding structure adapted to address both error reduction and timing issues; enforcing RLL constraint on convolutional code; making efficient use of redundancy, previously used only to enforce RLL constraints, and significantly reducing the system BER; thereby providing optimal system performance in data transceiving applications.

The invention provides a method of processing data in a data transceiving system in which a code structure is provided and adapted to alter data in accordance with a pattern by a system designer or user, the code structure is also adapted to ensure that data it processes also complies with a predetermined synchronization constraint, and the code structure is interposed within the system's data processing path such that any data processed by the system is also processed by the code structure.

More specifically, the invention provides a method of enforcing run-length limit constraints on convolutional codes in which the system designer or user defines a desired run length limit constraint for the system, as well as a pattern for coding and decoding of data, data is processed with a first code structure to apply the patterning to the data, the data is evaluated and processed in reference to the desired RLL constraint such that any data bits not in compliance with the RLL constraint are converted to erasure locations, the data is further processed by a transceiver system or device, a second code structure evaluates data received from the transceiver system in reference to the patterning, seeking and identifying likely erasure locations, and excluding the data in likely erasure locations from the decoding process.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of the various embodiments are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention details a coding structure that provides both an error rate reduction in data being processed and ensures that timing constraints for the system are met. Recognizing that RLL structures are widely implemented in systems designs, but that the actual activation of those RLL structures is rare, the present invention replaces the RLL structures with a coding structure designed to make efficient use of data redundancy.

As will be apparent to one skilled in the art, the present invention may be employed in any data transceiving system where data redundancy is used to maintain system timing and/or ensure clock recovery. The underlying principle of this invention is applicable, and its implementation readily adaptable, in a wide range of signal processing applications. All such embodiments are comprehended by the present invention.

For purposes of illustration and explanation, certain aspects of the present invention are hereinafter detailed in relation with data storage systems. It will be apparent to one skilled in the art, however, that the present invention may be employed in any system transceiving data. Such systems include, but are not limited to, data transmission systems, such as telecommunication systems, and data storage systems, such as magnetic storage devices. All such applications and embodiments of the present invention are comprehended by the present invention.

Figure 1:
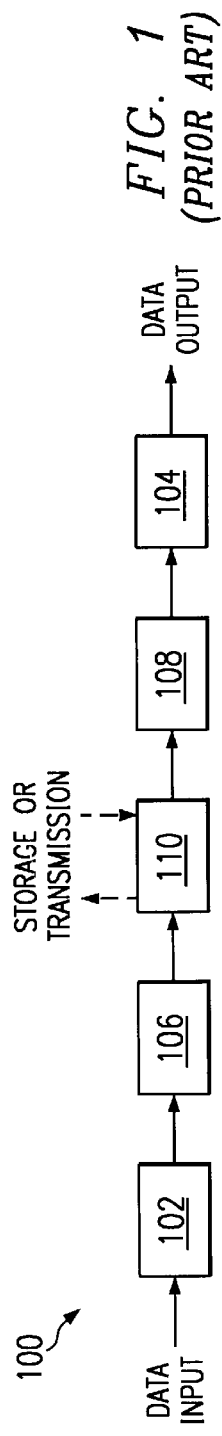
FIG. 1 is an illustrative embodiment of a prior art data transceiving system.

For purposes of illustration, FIG. 1 depicts a prior art data transceiving system 100. System 100 includes an RLL encode element 102 and an RLL decode element 104. System 100 further includes precode element 106, postcode element 108, and data transceiver 110.

Data is processed sequentially through the system 100 as illustrated in FIG. 1. Data is input to the system 100, passing through RLL element 102, output from element 102 to precode element 106, and output from element 106 to transceiver 110. Transceiver 110 may comprise any one of numerous data storage or transmission systems. Data is processed by transceiver 100 and is output to postcode element 108, which in turn passes the data to RLL decode element 104. Data is then output by element 104 from the system 100.

RLL code and decode elements 102 and 104 operate to ensure that the system timing and synchronization is maintained as data is processed by the system 100. As data processed through the system 100, RLL elements 102 and 104 operate to ensure that the data complies with the RLL coding constraints as defined by the user. RLL element 102 is employed to ensure that the output of that encode element will meet the minimum or maximum threshold constraints of the RLL structure. RLL element 104 may perform an inverse table look-up on the data it receives from transceiver 110 to determine what data was originally transmitted. Elements 102 and 104 are thus employed to maintain timing synchronization of the system 100.

Precode element 106 and postcode element 108 operate to format and evaluate data with respect to known patterns designated by the system designer. Precode element 106 thus formats the data being processed by system 100 according to the desired pattern before the data is passed to transceiver 110. Conversely, postcode element 108 receives data from transceiver 110, and analyzes that data according to the pattern. At this point, the data can be evaluated for errors, and correction techniques employed if necessary.

Figure 2:
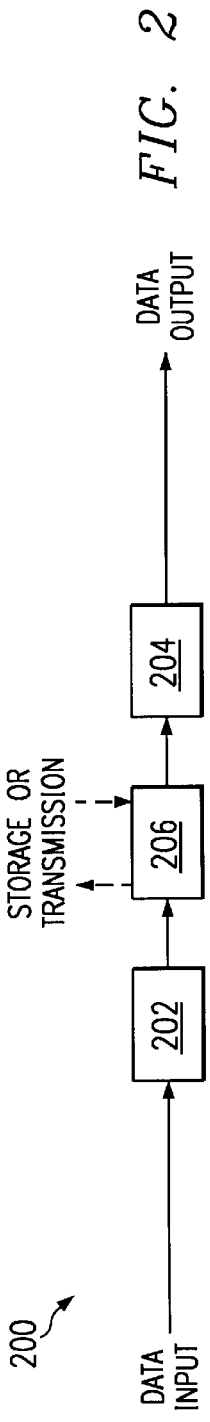
FIG. 2 is an illustrative embodiment of a data transceiving system according to the present invention.

The present invention overcomes the limitations inherent in such designs. Referring now to FIG. 2, a data transceiving system 200 according to the present invention is depicted. System 200 comprises an optimized code element 202, an optimized decode element 204, and a signal transceiver system 206. Data processes through system 200; being input through code element 202, which receives the data and performs both RLL constraint functions and formatting of the data according to a use designated coding pattern, and then transfers from element 202 to transceiver system 206, which may store or communicate that data. Transceiver 206 then reads or receives data and transfers it on to decode element 204, which performs timing synchronization and clock recovery functions as well as evaluation of the data according to the coding pattern for identification and correction of errors, then be outputting the data from system 200.

Thus, the optimized coding structure of the present invention may be employed by system designers to dually provide BER reduction and RLL timing constraint, effectively replacing separate and individual RLL and standard coding structures. The present invention may alternatively be employed to replace only the RLL structures; thus providing RLL timing constraint and supplementing coding gain of collateral coding structures. With either alternative, the functional principles of the present invention are the same, and all such applications and embodiments of the present invention are thus comprehended. The functional principles of the present invention are illustrated in FIG. 3 in relation to the latter of these alternatives.

Figure 3:
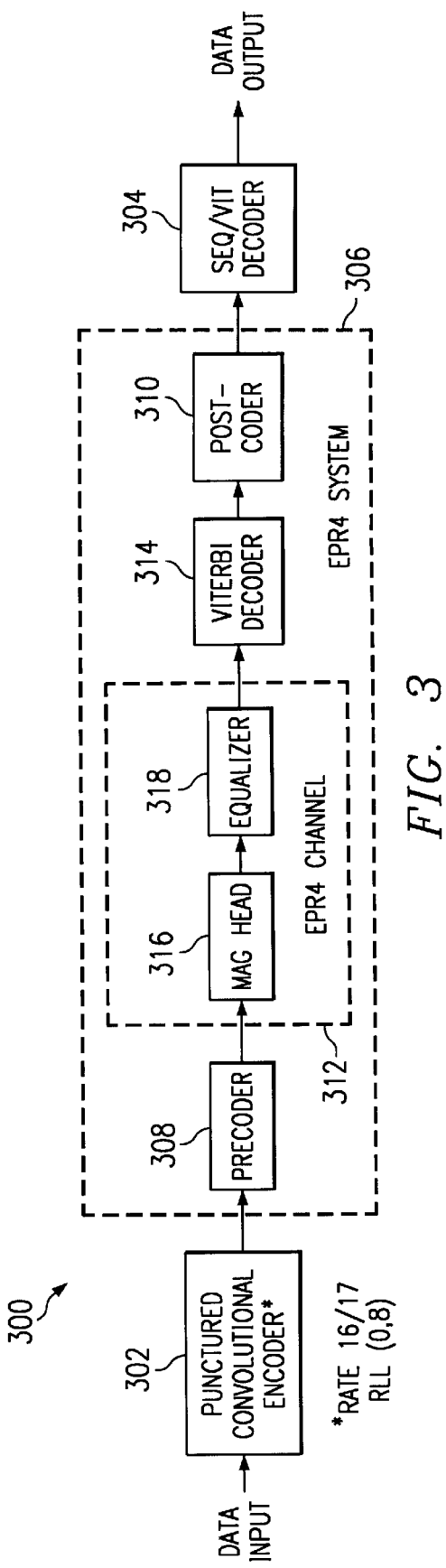
FIG. 3 is an illustrative embodiment of a data storage system.

Referring now to FIG. 3, one specific implementation of the present invention is depicted. For purposes of illustration, FIG. 3 illustrates the present invention in relation to a data storage application using an Extended Partial Response class 4 ("EPR4") design.

A data storage system 300 is shown. System 300 comprises: an optimized coding element 302; an optimized decoding element 304; and a signal transceiving system 306.

Transceiving system 306 further comprises a precode element 308, a postcode element 310, a signal transceiver element 312, and a Viterbi decode element 314.

Transceiver element 312 further comprises a magnetic head element 316 and an equalizer element 318.

Storage system 300 is adapted to receive data input, process that data through coding element 302, transfer data from element 302 to, and process the data through, precode element 308, and transfer the data from precode element 308 to head element 316. Head element 316 operates (not shown) to write the data received from precode element 308 to a magnetic storage medium, and transfer data read from the magnetic storage medium to equalizer element 318. Equalizer element 318 operates to filter and limit signal interference in the data received from head element 316. The data then passes from equalizer element 318 onto the Viterbi decoder element 314, which is employed to render maximum likelihood estimate for the data. The data then transfers to, and is processed by, postcode element 310 and optimized decoding element 304, sequentially, finally output from system 300 by element 304.

Precode element 308 and postcode element 310 are standard coding structures employed by the system designer to limit the propagation of errors arising in the data as it is processed by system 300, effecting some measure of coding gain.

The present invention, as depicted in FIG. 3, replaces conventional RLL structure with an optimized code structure. The optimized code structure of the present invention is designed such that it provides timing recovery, thereby addressing the functionality of previous RLL structures; and provides further reduction the error rates of the code processing system.

According to the present invention, optimized coding element 302 is designed to provide both coding gain and ensure system timing synchronization.

For this particular embodiment, an RLL(0,8) timing constraint is desired by the system designer or user.

In the storage system 300 illustrated in FIG. 3, in order to meet the timing restraint requirements equivalent to an RLL (0,8) system, the system needs to match a code rate of 16/17. The system thus requires a type of convolutional code with a rate that can be increased to match the desired system rate. Such a type of convolutional code is referred to as a punctured convolutional code.

Coding element 302 is thus depicted as a punctured convolutional encoder; designed to address a rate 16/17 coding scheme and having all properties of a standard error reduction code structure, and also ensuring that the data processing system meets the minimum and maximum thresholds of the desired RLL (0,8) constraints.

The punctured convolutional code disregards bits coming out of the convolutional code structure according to a pattern, called a perforation pattern, predetermined by the 5 system designer or user. As positions of these disregarded bits are known, the decoding algorithm is designed to account for the discarding of those bits according to the pattern. The system thus realizes lower error rates by evaluating the output of the coding structure and applying the predetermined perforation pattern to decode according to that pattern.

In order to further ensure that the RLL constraints of the system are met, the optimized code of the present invention employs erasure decoding. As data processes through the optimized coding element 302, the output of optimized coding element 302 is evaluated. If the data output from element 302 violates the desired RLL constraints of the system, the system then introduces an error (e.g., inserting a 1 bit), effectively erasing the data bit in violation of the constraint, rendering that data location an erasure location.

The data being transferred thus includes an error inserted by the system, however, system synchronization remains unaffected as the RLL constraints of the system have not been violated. Thus, system timing will not go out of synchronization.

Subsequently, as the data, now containing a system-inserted error, is decoded, specific data locations are evaluated to see if it might contain a self-induced error as introduced by the system (e.g. after eight zeroes). If the data location is evaluated by the system to be a possible erasure location, that specific data bit is removed from the system's decoding decision process, such that the bit in question is not considered in the determination of closest allowable data sequences.

Thus, the system 300 employs an optimized code structure that provides both RLL constraint and coding gains (i.e., a reduction in the system error rates); the optimized code structure utilizing erasure decoding to achieve this result.

The benefits of the present invention may be realized by any one of numerous system implementations including, but not limited to, circuitry, software, or some combination thereof (e.g. a signal processor routine).

While this invention has been described in reference to the illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of enforcing run-length limit constraints on convolutional codes comprising the steps of:

providing a desired run length limit constraint;

providing a first convolutional code structure;

processing data with said first convolutional code structure such that said convolutional code structure applies a predetermined patterning to said data;

evaluating and processing said data in reference to said desired run length limit constraint such that any of said data that is not compliant with said desired run length limit constraint is altered to become compliant;

further processing said data;

providing a second convolutional code structure;

evaluating said further processed data with said second convolutional code structure in reference to said predetermined patterning, such that altered data is identified; and processing said further processed data with said second convolutional code structure in reference to said predetermined patterning such that said identified data is excluded.

2. The method of claim 1 wherein the step of further processing said data further comprises storing said data to a storage medium and retrieving said data from said storage medium.

3. The method of claim 1 wherein an Extended Partial Response class 4 data processing system performs the step of further processing said data.

4. A method of processing data in a system comprising the steps of:

providing a code structure;

adapting said code structure to alter data in accordance with a predetermined pattern;

adapting said code structure such that data processed by said code structure complies with a predetermined constraint;

interposing said code structure within said system such that said code structure is incorporated into a data processing path; and providing and applying data to said data processing path such that said data is processed by said code structure;

wherein the step of providing and applying data to said data processing path such that said data is processed by said code structure further comprises evaluating and processing said data by said code structure in reference to said predetermined constraint such that any of said data that is not compliant with said predetermined constraint is altered to become complaint.

5. A method of processing data in a system comprising the steps of:

providing a code structure;

adapting said code structure to alter data in accordance with a predetermined pattern;

adapting said code structure such that data processed by said code structure complies with a predetermined constraint;

interposing said code structure within said system such that said code structure is incorporated into a data processing path; and providing and applying data to said data processing path such that said data is processed by said code structure;

wherein the step of providing a code structure further comprises providing a separate coding and decoding element of said code structure; and wherein the method further comprising the step of evaluating and processing said data in reference to predetermined constraint such that any of said data that is not compliant with said predetermined constraint is altered to become compliant.

6. The method of claim 5 further comprising the step of further processing said data with said decoding element in reference to said predetermined patterning such that said identified data is excluded.

* * * * *